United States Patent

Class, Jr. et al.

[15] 3,644,980

[45] Feb. 29, 1972

[54] COMPONENT REMOVAL DEVICE

[72] Inventors: Charles A. Class, Jr., Oreland; Robert M. Van Zyl, Lafayette Hill; Donald C. Sedberry, Oreland, all of Pa.

[73] Assignee: Pace, Inc., Silver Spring, Md.

[22] Filed: June 25, 1969

[21] Appl. No.: 836,391

[52] U.S. Cl. ....29/203 B, 29/200 D, 228/20

[51] Int. Cl. ....H01r 3/00

[58] Field of Search ....29/575, 203 B, 200 D, 426; 228/19, 20, 4, 40

[56] References Cited

UNITED STATES PATENTS

| | | | |
|---|---|---|---|
| 3,045,095 | 7/1962 | Usher et al. | 228/20 X |
| 3,056,371 | 10/1962 | Frank | 228/40 |
| 3,084,649 | 4/1963 | Parstorfer | 228/19 |
| 3,210,182 | 10/1965 | Funari | 228/19 UX |
| 3,230,338 | 1/1966 | Kawecki | 29/203 B UX |
| 3,382,564 | 5/1968 | Gallentine | 228/20 X |
| 3,442,450 | 5/1969 | Ackerman et al. | 29/203 B UX |

*Primary Examiner*—Frank T. Yost
*Attorney*—Fidelman, Wolffe and Leitner

[57] ABSTRACT

An apparatus to permit the removal of soldered components from a mounting surface. A molten solder bath is employed to heat the securing solder to its melting point. A spring loaded gripper device holds the component during the heating operation. When the securing solder becomes liquid the component is lifted from the mounting surface by the gripper device. During this removal process a vacuum is applied to the mounting area to remove the liquid solder from the mounting holes and the surrounding surface.

3 Claims, 1 Drawing Figure

Patented Feb. 29, 1972 3,644,980
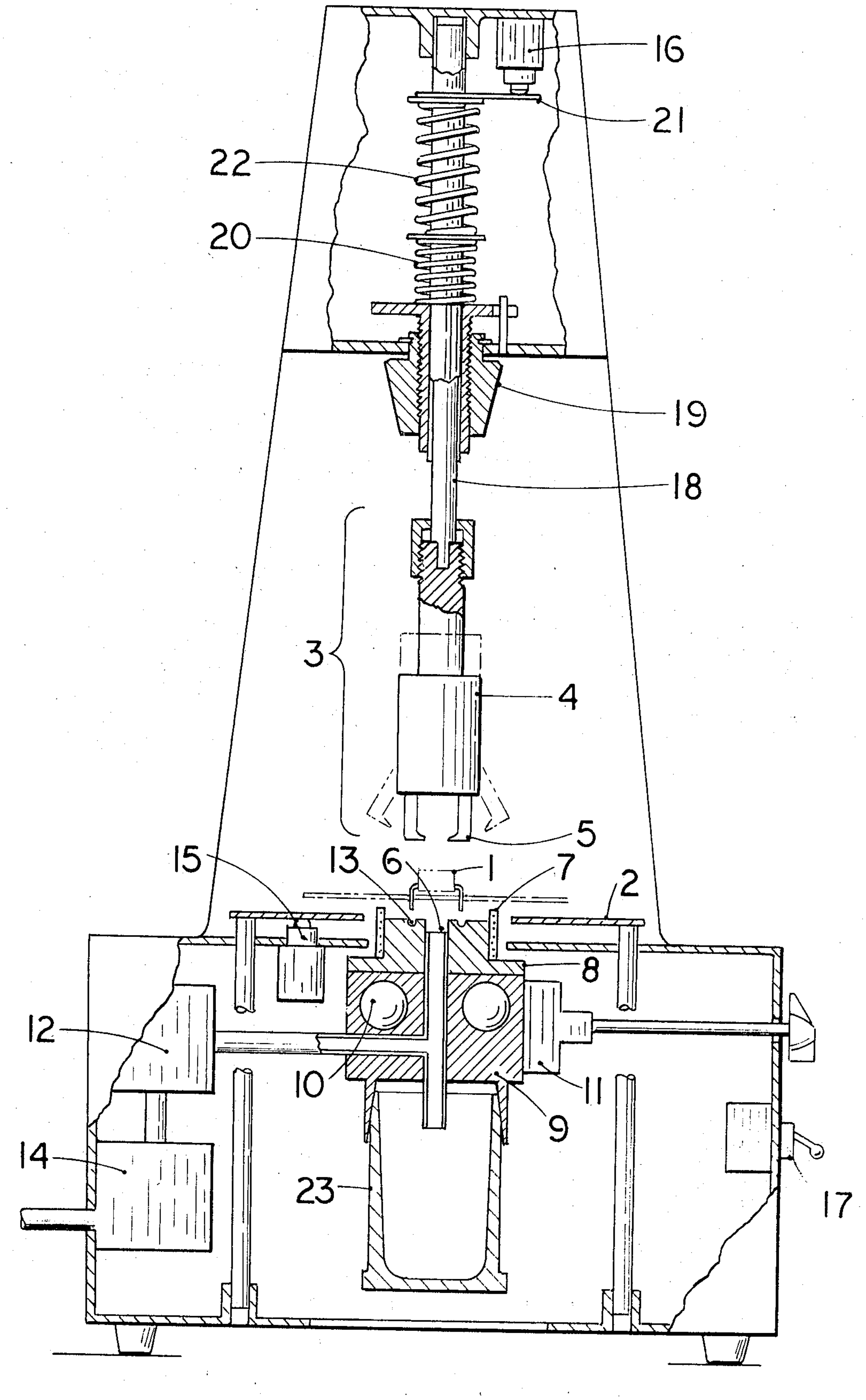

COMPONENT REMOVAL DEVICE

This invention relates to a device to remove single and multilead electronic components, such as transistors and integrated circuit modules, that are mounted to a printed circuit board through holes and are secured to the mounting surface by means of solder. The removal of the electronic component is accomplished without damage to the component or the mounting surface and circuitry. The securing solder is removed from the mounting holes and surrounding areas during the removal process.

Most of the arrangements presently used for removal of soldered electronic components are limited to the heating of the component leads, individually or collectively, and the surrounding mounting surfaces to the point that the solder is molten. The electronic component is then manually extracted from the mounting surface. These methods have shortcomings in that damage to the mounting surface, frequently employing copper clad circuitry, can result from the prolonged application of heat. Also, using existing methods, the mounting holes and surrounding areas are left with residual solder after the extraction of the component is complete. Various methods are presently employed to remove the residual solder as a separate operation. The hole and the surrounding areas are again heated until the solder is molten. A vacuum is then applied to the mounting surface to suck the solder from the hole and surrounding area. In the case of multilead components this is done individually to each mounting hole. Alternate methods use a positive airblast to blow the liquid solder from the hole and mounting surface. Wicking devices have also been used to remove the liquid solder from individual mounting holes.

The present invention relates to an apparatus which permits single and multilead through hole mounted electronic components to be removed from the mounting surface with no damage to the mounting surface, circuitry, or the component and will remove the securing solder from the mounting holes and surrounding area of the mounting surface during the removal operation.

Specifically, the present invention contemplates a structural arrangement comprised of a frame for positioning the heating device, vacuum system, extraction device, and associated controls.

Other objects and many of the attendant advantages of the present invention will become more apparent with the reading of the following description in conjunction with the attached drawing wherein:

The FIGURE illustrates in block diagram form a preferred embodiment of the present invention.

The mounted electronic component 1, usually on a printed circuit board, is positioned on the support platform 2. The gripper head 3 is lowered with the collar 4 in the raised position so that the jaws 5 are extended. When the gripper head is over the component the collar 4 is lowered so that the jaws 5 are retracted to grip the component. The combination is then lowered so that the component leads contact the heating medium. To apply heat to the securing solder the leads of the component 1 are placed in contact with a trough of molten solder 13 that has been heated to a temperature sufficiently high to melt the securing solder. An insulating spacer 7 positions the mounting surface such that only the protruding leads of the mounted component contact the molten solder. The molten solder is contained in a trough sufficiently large to encompass the lead pattern of the component to be removed. The trough is incorporated into a removable plate 8 from the heat sink 9 so that various lead configurations can be accommodated by using different plates 8. The heat sink 9 is a block of metal with sufficient mass to retain heat for efficient transfer to the trough. Various means can be employed to supply thermal energy to the heat sink 9. An electrical heater 10, of a type well known to the art, is imbedded in or attached to the heat sink 9 to supply heat. A temperature control 11 is utilized to maintain the heat sink at a constant temperature. Methods of control well known to the art are used, a bimetallic switch of a type well known to the art is used to control the temperature of the heat sink. Vacuum or positive pressure air is supplied to the apparatus from either a permanent external supply or from a portable supply unit of a type well known to the art. If positive air is supplied a vacuum transducer 12, of a type well known to the art, is utilized to obtain a vacuum supply to the mounting hole area at a recess 6 in the plate 8. An electrical solenoid valve 14, of a type well known to the art, is used to turn on the vacuum or positive pressure supply. The valve is actuated while the component is being removed from the mounting surface, after the component is removed, or before the component is removed. Means are provided to actuate the valve 14 automatically as the component is being removed, or after it is removed, by the actuation of a switch 16, of a type well known to the art. A removable container 23 is installed in the vacuum supply line to collect the residual solder from the mounting holes, mounting surface and troughs. A separate switch 15, is triggered when the mounting surface is removed from the apparatus. An alternate manual switch 17 can be used to apply vacuum or pressure for any length of time at any time.

A movable spring supported plate 2 is used to position the component mounting surface on the apparatus such that contact with the heat sink 9 or trough 13 is precluded until desired. When contact is desired the plate 2, or mounting surface, is pushed down until the mounting surface contacts the insulating spacer 7 or a mechanical stop which is set at a position to prevent contact between the removable plate 8 and the component mounting surface.

A spring loaded gripper device 3 is used to hold the component during the heating operation and to remove it from the mounting surface when the securing solder becomes liquid. Various configurations of gripping heads may be used to conform to the design of the component being extracted. The gripper head 3 is separable from the spring loaded shaft 18. The gripper head 3 consists of an arrangement of movable jaws 5 which are pivoted and are of such configuration and location to be compatible with the component being extracted. A collar 4 encompasses the jaws such that when the collar is raised the jaws are extended open to permit entry of the component body. When the collar is lowered the jaws are pivoted inward to clamp under the component to be extracted. Release of the component is accomplished by raising the collar.

The shaft 18 is spring loaded such that the applied spring load on the shaft is variable by turning the collar 19. Two compression springs are employed. One, spring 22, is positioned under washer and pin 21 and applies an upward force $F_1$. A second washer and spring 20 is positioned below spring 22 and applies an upward force $F_2$. The force on the shaft 18, and therefore, the extraction force on the electronic component, is $F_x=F_1+F_2$ when the gripper head is lowered a distance $d_1$ from the neutral position. $F_x$ can be adjusted by turning collar 19 thereby varying distance $d_2$, and the overall deflection of the two springs, when the shaft 18 is moved a distance $d_1$. The extraction force on the component $F_x$ can be expressed as $F_x=F_1+F_2$. The spring 22 has a lower spring rate than spring 20 thereby permitting variable extraction force.

We claim:

1. Apparatus for removing through the board mounted multilead electronic components from printed circuit boards comprising means for heating securing solder to the liquid state without damaging the printed circuit board, said means having a heat sink with an integral electrical thermal source, a trough conforming to a component mounting hole pattern and containing molten solder and a thermal switch to control the temperature of the heat sink; means for extracting a component from the circuit board; a tubular vacuum connection to permit vacuum to be applied to component mounting holes to remove securing solder in the liquid state from said mounting holes, through said heat sink and into a collector cup.

2. Apparatus according to claim 1 wherein said extracting means consists of a replaceable component gripper having a set of levered jaws that conform to and positively grip the component body, a mating sleeve with integral cam to actuate said jaws, a vertical shaft mounting said jaws over said trough and two springs in series and adjustment means mounted on said shaft to provide a variable extraction force on a component.

3. The apparatus according to claim 1 wherein said trough means holds the molten solder used for heat transfer to the securing solder and comprises a replaceable plate that is machined to conform to the component mounting hole pattern and is provided with a vacuum connection that permits the application of vacuum to the component holes, an insulator that protects the printed circuit board from contacting the plate, and also seals the bottom of the board so that the vacuum is directed through the component mounting holes.

* * * * *